(12) United States Patent
Mirloup et al.

(10) Patent No.: US 11,401,284 B2
(45) Date of Patent: Aug. 2, 2022

(54) ORGANIC SEMICONDUCTING MATERIAL AND ITS SYNTHESIS AND ORGANIC SEMICONDUCTING COMPONENT WITH THE MATERIAL

(71) Applicant: Heliatek GmbH, Dresden (DE)

(72) Inventors: Antoine Mirloup, Ulm (DE); Daniel D'Souza, Dresden (DE); Roland Fitzner, Ulm (DE); Olga Gerdes, Ulm (DE); Dirk Hildebrandt, Ulm (DE); Gunter Mattersteig, Ulm (DE); Andre Weiss, Dresden (DE)

(73) Assignee: HELIATEK GMBH, Dresden (DE)

( * ) Notice: Subject to any disclaimer, the term of this patent is extended or adjusted under 35 U.S.C. 154(b) by 0 days.

(21) Appl. No.: 16/556,466

(22) Filed: Aug. 30, 2019

(65) Prior Publication Data
US 2020/0071343 A1 Mar. 5, 2020

(30) Foreign Application Priority Data
Aug. 30, 2018 (EP) ..................... 18191861

(51) Int. Cl.
*C07F 5/02* (2006.01)
*H01L 51/00* (2006.01)
*H01L 51/52* (2006.01)

(52) U.S. Cl.
CPC ............ *C07F 5/022* (2013.01); *H01L 51/008* (2013.01); *H01L 51/5203* (2013.01)

(58) Field of Classification Search
USPC ....................................................... 540/452
See application file for complete search history.

(56) References Cited

U.S. PATENT DOCUMENTS

| | | |
|---|---|---|
| 2007/0090371 A1 | 4/2007 | Drechsel et al. |
| 2009/0176313 A1 | 7/2009 | Citterio et al. |
| 2012/0126213 A1 | 5/2012 | Gresser et al. |
| 2013/0160829 A1 | 6/2013 | Maennig et al. |
| 2016/0141497 A1 | 5/2016 | Gerdes et al. |

FOREIGN PATENT DOCUMENTS

| | | |
|---|---|---|
| DE | 19957001 A1 | 5/2001 |
| WO | WO 2004083958 A2 | 9/2004 |
| WO | WO 2007126052 A1 | 11/2007 |
| WO | WO 2010133208 A1 | 11/2010 |
| WO | WO 2011161108 A1 | 12/2011 |
| WO | WO 2014206860 A1 | 12/2014 |
| WO | WO 2015036529 A1 | 3/2015 |

OTHER PUBLICATIONS

Jiang et al. European Journal of Organic Chemistry, 2017(34), 5074-5079.*
Zeya Feng et al., "Regioselective and Stepwise Syntheses of Functional BODIPY Dyes through Palladium-Catalyzed Crosscoupling Reactions and Direct C-H Arylations," The Journal Of Organic Chemistry, Jul. 2016, p. 6281-6291, American Chemical Society, Washington D.C., USA.
Liao Junxu et al., "Synthesis, optical and electrochemical properties of novel meso-triphenylamine-BODIPY dyes with aromatic moieties at 3,5-positions", Tetrahedron, May 2015, p. 5078-5084, Elsevier, Amsterdam, Netherlands.
Sobenina Lubov N. et al., "General Route to Symmetric and Asymmetric meso-$CF_3$-3(5)-Aryl(hetaryl)- and 3,5- Diaryl(dihetaryl)-BODIPY Dyes", Organic Letters, May 2011, p. 2524-2527, 13:10, American Chemical Society, Washington D.C., USA.
Andrei Afonin et al., "Structural studies of meso-$CF_3$-3(5)aryl(hetaryl)- and 3,5-diaryl(dihetaryl)-BODIPY dyes by $^1$H, $^{13}$C and $^{19}$F NMR spectroscopy and OFT calculations", Journal Of Fluorine Chemistry, Jan. 2013, p. 51-57, 145, Elsevier, Amsterdam, Netherlands.
K.B. Petrushenko et al., "Novel environment-sensitive 8-$CF_3$-BODIPY dye with 4-(dimethylamino)phenyl group at the 3-position: Synthesis and optical properties", Dyes and Pigments, Sep. 2016, p. 488-495, 136, Elsevier, Amsterdam, Netherlands.

* cited by examiner

*Primary Examiner* — Ana Z Muresan
(74) *Attorney, Agent, or Firm* — Leydig, Voit & Mayer, Ltd.

(57) ABSTRACT

New absorbing materials of formula (I) for use in organic semiconducting components:

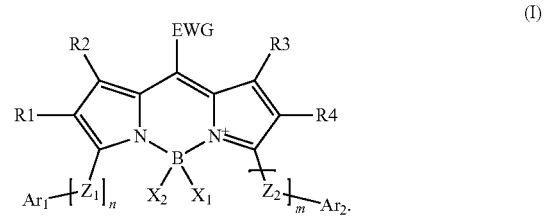

(I)

16 Claims, No Drawings

ORGANIC SEMICONDUCTING MATERIAL AND ITS SYNTHESIS AND ORGANIC SEMICONDUCTING COMPONENT WITH THE MATERIAL

CROSS-REFERENCE TO PRIOR APPLICATIONS

Priority is claimed to European Patent Application No. EP 18191861.6, filed on Aug. 30, 2018, the entire disclosure of which is hereby incorporated by reference herein.

FIELD

The invention relates to an organic material with a dipyrrin skeleton, and its synthesis and use in semiconducting devices, especially in organic semiconducting devices.

BACKGROUND

In organic electronics, interconnections of electrically conductive polymers or small organic molecules are used.

The invention relates to so-called "small molecules" that are non-polymeric organic molecules having a defined molecular structure and a molar mass between 100 to 2000 g/mol.

Organic electronic components can be, for example, displays, data memories or transistors, and in particular field-effect transistors. These devices also include organic optoelectronic devices such as organic photoactive devices. Such devices include solar cells and photodetectors comprising a photoactive layer in which charge carriers, e.g. bound electron-hole pairs (excitons), are generated. Further optoelectronic components are light-emitting electroluminescent components, which emit light when current flows through them.

Optoelectronic components comprise at least two electrodes, one electrode being applied to the substrate and the other acting as a counterelectrode. Between the electrodes is at least one photoactive layer, preferably at least one organic photoactive layer, as a light-absorbing layer, which may be formed as a mixed, or a stack of mixed and/or individual, layers. The inventors mean that under the at least one photoactive layer, a layer which actively contributes as an absorber layer by absorption of light contributes to the conversion of light energy into electrical energy. Additionallayers, for example transport layers, may be arranged between the electrodes. Further, a plurality of layer sequences can be stacked on top of each other between the two electrodes to form tandem or multi-stacked cells, wherein this layer sequence comprises at least one photoactive layer and at least one additional doped, undoped or partially doped layer as a transport layer, for example, pin/nip structures according to WO 2004/083,958 A2 or WO 2011/161,108 A1, and wherein each of these layers can consist of several layers.

Bura et al., J. Am. Chem. Soc. (2012), 134, 17404-17407 describes, for example, BODIPY dyes with iodoaryl radicals in the meso position of the dipyrrin skeleton and their use in solvent-processed organic solar cells.

WO 2015/036,529 A1 discloses the use of a pyrrolopyrrole-based compound in an apparatus of organic electronics.

WO 2010/133,208 A1 describes an organic semiconductor comprising a plurality of layers, wherein at least one of the layers comprises a material having an azabodipy skeleton.

SUMMARY

By using suitable novel organic materials, various novel components can be provided. As a result, the development of new applications that are thin, flexible, light and with colour variability, and also are inexpensive, is given.

There are currently known only a few NIR (near-infrared) absorbers in the range of 650 to 1400 nm for use in organic optoelectronics, especially in the area of non-polymeric compounds. NIR absorbers are of particular interest because they absorb in the non-visible region of the light spectrum and therefore appear transparent to the human observer, or, when used in combination with coloured absorbers, a wider range of the solar spectrum may be used.

NIR dyes known in the prior art are partially unsatisfactory. For example, their processability is not sufficient and/or they are not thermally stable during evaporation in vacuum. Typical organic infrared absorbers are cyanine dyes, used for optical recording media and described, for example, in DE 199 57 001 A1. Due to the ionic structure of cyanine dyes, extraordinarily high evaporation temperatures are expected, which cannot be achieved in practice because thermal decomposition of the dyes occurs before evaporation temperatures can be reached.

In addition, many NIR dyes known in the art do not have satisfactory thin film absorptivity due, for example, to improper film orientation, preferential orientation, low molar extinction coefficient, insufficient photostability, insufficient transport properties, or they do not fit energetically into the device. In addition, their synthesis is often too long and expensive for a technical application to be economical.

Technical Problem

Organic semiconducting materials are sought which absorb in the near-infrared (NIR) region between about 650 and about 1400 nm, and which, when applied in organic electronic devices, lead to an improvement in the properties of the devices. The NIR absorbers should be synthetically readily accessible, meaning their syntheses involve only a limited number of steps and no complex steps, and they should be suitable for the production of vacuum-processed organic components, in particular of vacuum-processed organic solar cells or photodetectors.

Ideally, the desired absorber materials have a suitable preferential orientation during layer growth, so that the absorbed radiation can be used via the favourable transport properties of the charge carriers.

Disclosure of the Invention and Technical Effect of the Invention

According to the invention, the technical problem is solved by compounds of general formula (I):

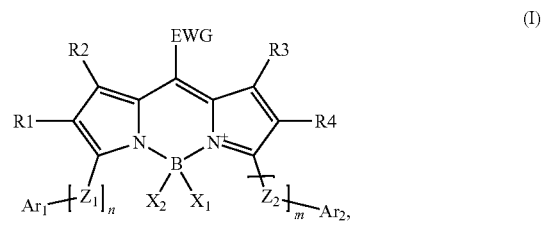

wherein
n and m are each independently 0, 1 or 2,
z1 and z2 are selected from the formulas (II) to (IV):

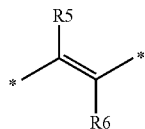
(II)

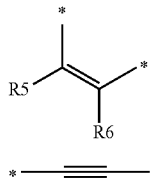
(III)

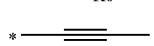
(IV)

wherein in each of formulas (II) to (IV) one term "*" represents a potential point of attachment of the substituent z1 or z2 to the dipyrrin skeleton and the other term "*" represents a potential point of attachment to one of the aryl substituents Ar1 and Ar2, Ar1 and Ar2 are each independently selected from aryl or heteroaryl, wherein Ar1 in the case of n=0 and/or Ar2 in the case of m=0, corresponds to the formula (V), and "*" refers to the bonding site of the substituent Ar1 or Ar2 to the dipyrrin skeleton:

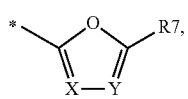
(V)

EWG is CN, or a fully or partially fluorinated, branched or unbranched, linear or cyclic alkyl chain, wherein hydrogen atoms of the alkyl chain may be substituted, and/or C atoms of the alkyl chain may be replaced by heteroatoms, preferably CN or CF3, X1 and X2 are selected from halogen, CN, alkyl, or fluorinated or partially fluorinated alkyl, alkenyl, alkynyl, alkoxy, aryl or heteroaryl, R1 to R4 are each independently selected from H, CN, halogen, or substituted or unsubstituted, branched or unbranched, linear or cyclic alkyl radical, and R5 and R6 are each independently selected from H, CN, halogen, or substituted or unsubstituted, branched or unbranched, linear or cyclic alkyl radical.

Further advantageous embodiments of the compounds according to the invention, as well as advantageous uses of the compounds, organic electronic components containing these compounds, and the synthesis of the compounds are the subject of further disclosure.

Advantageous Effect of the Invention

Surprisingly, it has been found that compounds of the invention, which on the one hand carry as a common structural element an electron withdrawing group on moiety EWG in the meso position of the dipyrrin skeleton, wherein the electron withdrawing group comprises either inductively withdrawing fluorine atoms or a cyano group which is both inductively and mesomerically withdrawing, or on the other hand carry in the 3,5-position of the dipyrrin skeleton a conjugated bond system characterized by a small spatial expanse, such as but not limited to, vinyl, alkynyl or furan units, broadly and strongly absorb near-infrared light. By contrast, the absorption of light in the visible range below 650 nm is relatively low, which is why the compounds according to the invention are suitable for the production of semi-transparent or transparent organic solar cells or photodetectors.

Furthermore, these compounds also have an increased charge carrier mobility, so that, in addition to photodetectors or solar cells, other organic electronic components comprising the compounds of the invention, such as transistors or OLEDs, may have improved electrical values.

The inventors have also found that the compounds of the invention can be used as charge transporting layers, e.g. as p-type materials, and thus it is possible to use them both in light-absorbing layers, as well as in charge carrier transport layers within a component.

The compounds of the invention are in particular "small molecules," which are understood to be non-polymeric organic molecules having a defined molecular structure and a molar mass of between 100 and 2000 g/mol, which may in particular also be monodisperse.

In an embodiment, organic materials comprising compounds of the invention are applied in the form of thin films or small volumes onto substrates by printing, gluing, coating, vapor-deposition or other means. All processes which are also used for electronics on ceramic or semiconducting substrates are also suitable for the production of thin layers.

DETAILED DESCRIPTION OF THE INVENTION

An embodiment of the present invention provides a compound of general formula (I):

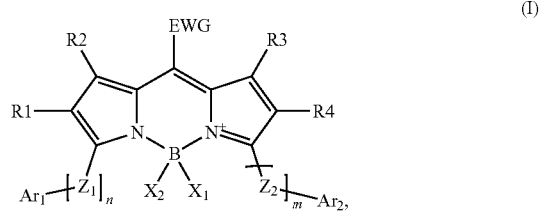
(I)

wherein:
n and m are each independently 0 or 1 or 2,
z1 and z2 are selected from the formulas (II) to (IV):

(II)

-continued

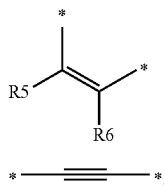

(III)

(IV)

wherein in each of formulas (II) to (IV), one of the "*" denotes a bonding site of the substituent z1 or z2 to the dipyrrin skeleton, and the other of the "*" denotes a bonding site to one of the the aryl substituents Ar1 and Ar2, Ar1 and Ar2 are each independently selected from an aryl or heteroaryl, each having not more than 20, more preferably not more than 10, very preferably not more than 6 carbon units, and Ar1 in the case of n=0 and/or Ar2 in the case of m=0 corresponds to formula (V), and "*" denotes the point of attachment of Ar1 or Ar2 to the dipyrrin skeleton:

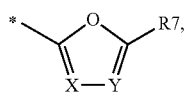

(V)

EWG is CN, or a fully or partially fluorinated, branched or unbranched, linear or cyclic alkyl chain, preferably with a maximum of 10, more preferably with a maximum of 6 carbon units, wherein hydrogen atoms and/or carbon atoms of the alkyl chain may be substituted, X1 and X2 are each selected from halogen, CN, alkyl, or fluorinated or partially fluorinated alkyl, alkenyl, alkynyl, alkoxy, aryl or heteroaryl, preferably with a maximum of 6, more preferably with a maximum of 3 carbon units, and R1 to R6 are each independently selected from H, CN, halogen, or a substituted or unsubstituted, branched or unbranched, linear or cyclic alkyl radical, preferably with a maximum of 6 carbon units.

In a preferred embodiment, the compounds of the invention have no ring structure between R1 and R2 and/or between R3 and R4.

In an embodiment, EWG is selected from CN or CF3.

In an embodiment, X1 and X2 are each a halogen, preferably F.

In an embodiment, R1 to R4 are independently selected from H, methyl or alkyl, preferably H.

In an embodiment, R5 or R6 are independently selected from H, methyl or alkyl, preferably H.

In an embodiment, in formula (V), X is independently selected from N or C—R8, and Y is independently selected from N or C—R9.

In an embodiment, R7 to R9 are independently selected from:
a group of H, halogen, branched or linear, cyclic or open-chain alkyl, preferably with not more than 20, particularly preferably with maximally 10 carbon units, very particularly preferred with maximally 6 carbon units, wherein hydrogen atoms of the alkyl can be completely or partly replaced, in particular by a halogen, preferably F, and/or C atoms of the alkyl may be replaced by a heteroatom such as B, O or S, or a group of alkenyl, O-alkyl, S-alkyl, O-alkenyl, S-alkenyl, alkynyl, aryl or heteroaryl, in each case preferably with not more than 20, more preferably not more than 10, very particularly preferably not more than 6 carbon units in all these groups, and hydrogen atoms may be wholly or partially replaced, in particular by a halogen, preferably F, and/or C atoms may be replaced by a heteroatom, such as, B, O or S, or CN or NR'R", with R' and R" each independently selected from: H, or a branched or linear, cyclic or open-chain alkyl, preferably having not more than 20, more preferably having not more than 10 carbon units, wherein hydrogen atoms of the alkyl may be substitutedby halogen, and/or C atoms of the alkyl may be replaced by heteroatoms, e.g. O or S, aryl or heteroaryl groups.

By O-alkyl, O-alkenyl, S-alkyl or S-alkenyl is meant an alkyl/alkenyl in which at least one carbon atom is replaced by O or S.

In a particular embodiment, R7 and R9 of formula (V) may together form a homo- or heterocyclic, saturated or unsaturated, substituted or unsubstituted ring.

In an embodiment, when n>0 and/or m>0, then Ar1 if n>0, and/or Ar2 if m>0, is a substituted or unsubstituted heterocyclic 5-membered ring, preferably having heteroatoms selected from S or O.

In an embodiment, when n>0 and/or when m>0, then Ar1, if n>0, and/or Ar2, if m>0, is a substituted homocyclic 6-membered ring.

In an embodiment, the C atoms of the alkyl chain of the EWG moiety are replaced by heteroatoms, such as Si, O, S or N—R8, wherein R8 is selected from:
a group of H, halogen, branched or linear, cyclic or open-chain alkyl, preferably with a maximum of 20, more preferably with a maximum of 10 carbon units, very particularly preferably with a maximum of 6 carbon units, wherein hydrogen atoms of the alkyl may be wholly or partially replaced, in particular by a halogen, preferably F, and/or C atoms of the alkyl may be replaced by a heteroatom, such as B, O or S, or a group of alkenyl, O-alkyl, S-alkyl, O-alkenyl, S-alkenyl, alkynyl, aryl or heteroaryl, in each case preferably with not more than 20, more preferably not more than 10, very particularly preferably not more than 6 carbon units, hydrogen atoms in all or some of these groups may be replaced, in particular by a halogen, preferably F, and/or C atoms of the alkenyl and/or aryl may be replaced by a heteroatom, such as B, O or S, or CN or NR'R", wherein R' and R" are each independently selected from: H, or a branched or linear, cyclic or open-chain alkyl, preferably having not more than 20, more preferably not more than 10 carbon units, wherein hydrogen atoms of the alkyl may be substituted by halogen, and/or C atoms of the alkyl may be replaced by heteroatoms, e.g. O or S, aryl or heteroaryl groups.

In an embodiment, the compound according to the invention is mirror-symmetrical with respect to the axis formed by EWG and B.

The embodiments described above can be combined with each other.

According to the present invention, chemical compounds of formula (I) may be one of the following compounds:
Struktur 1
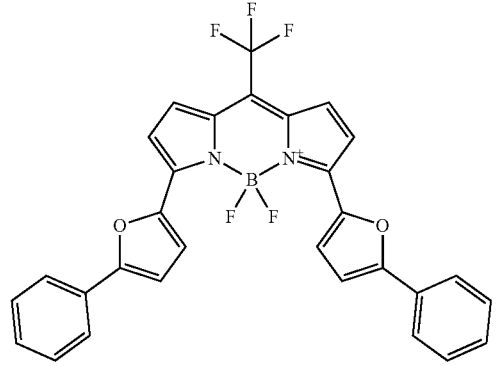
Struktur 2
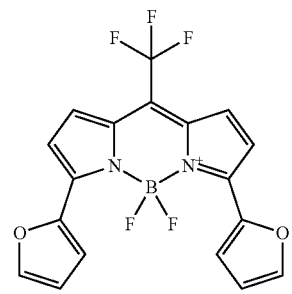
Struktur 3
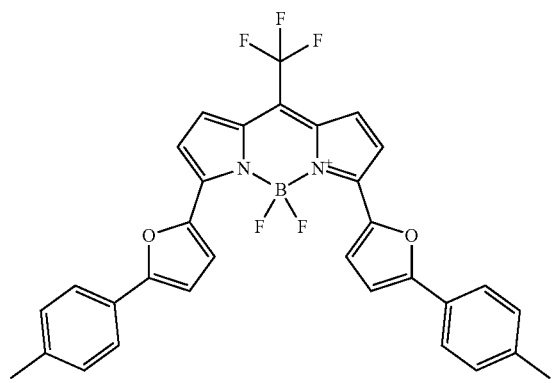
Struktur 4
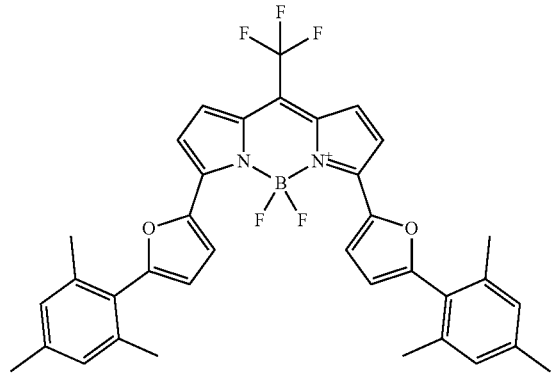
Struktur 5
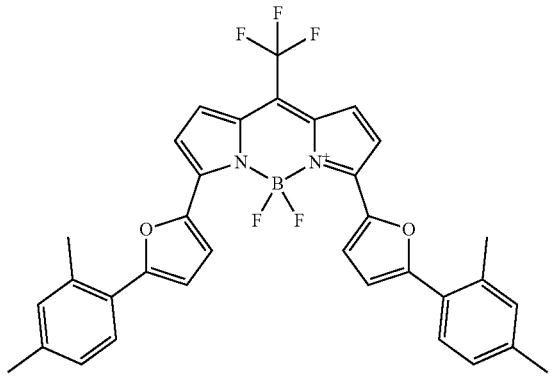
Struktur 6
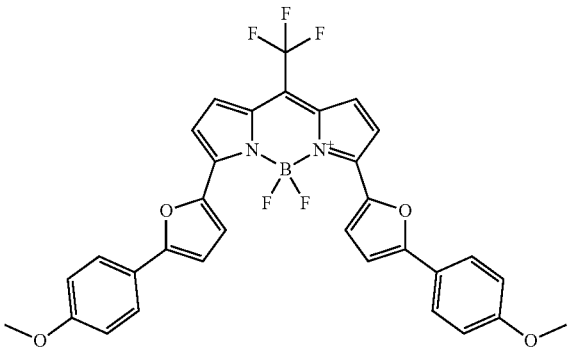
Struktur 7
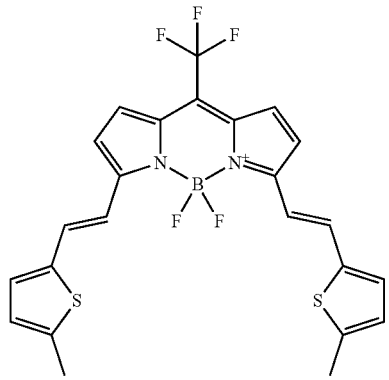
Struktur 8
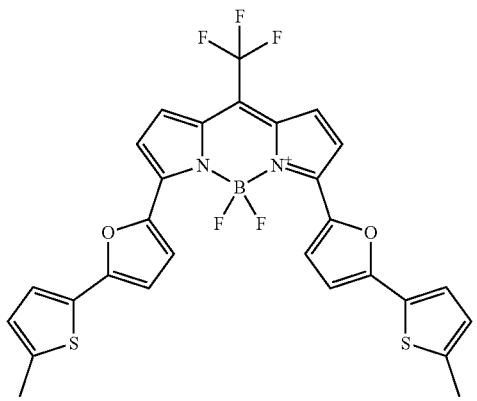

-continued

Struktur 9

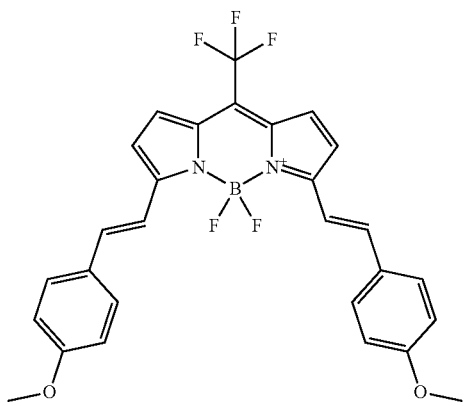

Struktur 10

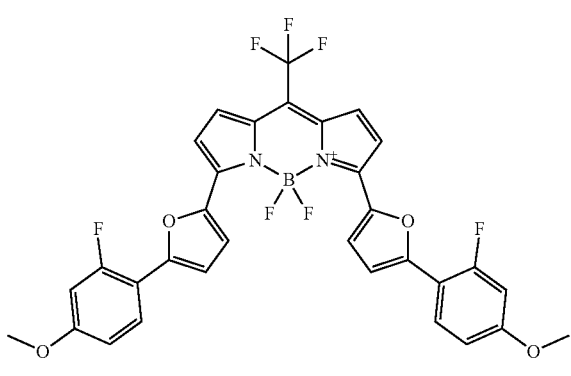

Struktur 11

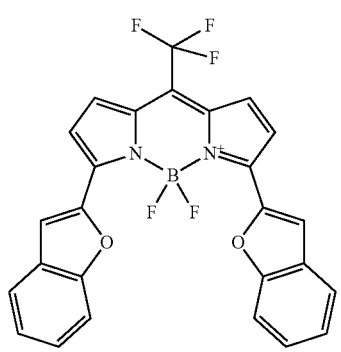

Struktur 12

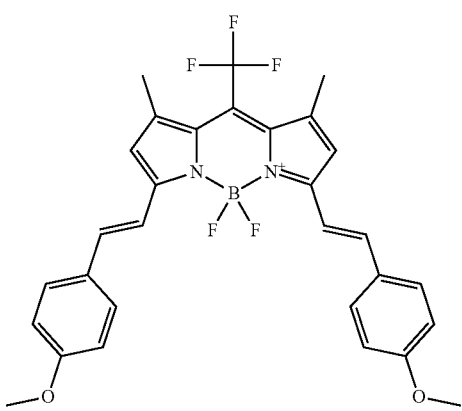

-continued

Struktur 13

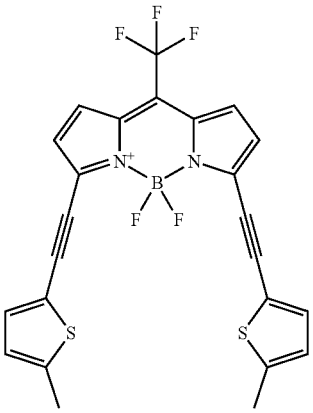

Struktur 14

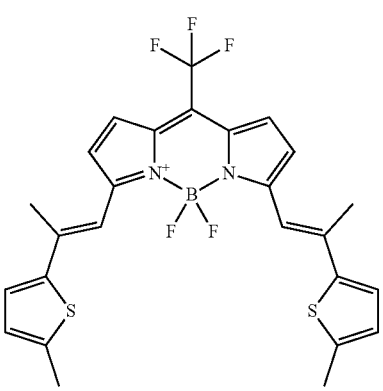

According to a further aspect of the present invention, the above-described compounds of the invention can be used in organic electronic components. This use is preferably carried out as an absorber material (light-absorbing material) in the photoactive layers (absorber layers), in particular in organic solar cells or photodetectors. Further, the materials can be used in charge carrier layers. Use is not limited to light-absorbing devices/components and use, for example, in OLEDs, is contemplated.

Use in a semiconductor component can take place both in a single layer and in a mixed layer. A mixed layer can be made, for example, by co-evaporation of two or more materials. Thus, an absorber layer can be prepared as a mixed layer, wherein at least one material acts as a donor and at least one material acts as an acceptor. Excitons are separated at the interface between donor and acceptor. The advantage of using a mixed layer (bulk-heterojunction) over a planar heterojunction, where donor and acceptor are present as two adjacent layers, is that the excitons only have to travel a short distance to the next boundary layer. As acceptor materials, for example, the materials according to WO 2004/083,958 A2 can be used.

Synthesis

The synthesis of the compounds of the invention can be carried out according to a modular system. The building blocks are provided on parallel synthetic routes, which can be advantageously combined with each other in a late reaction step via a classical C-C coupling reaction. The synthesis of compounds of formula (I) can be carried out by one of the methods described below.

The following description is intended to serve as an example and may be varied in order of its individual steps, or modified by other known methods. The summary of individual reaction steps or the modification of parts of the synthesis route is possible. The substituent Hal represents a functional group useful in cross-coupling reactions, such as carboxylic acids or triflates, including —H. The substituent Hal preferably represents a halogen component which is typically a halogen atom, preferably Cl, Br or I. Substituent M is a functional group useful in cross-coupling reactions including —H. Preferably, the substituent M is a metal component, as a metal or semimetallic functional group in a broader sense. The group M may in particular be selected from one of the following functional groups:

—SnR*$_3$, —B(OR*)$_2$, —Zn-Hal*, —Mg-Hal*, wherein R* is an alkyl, preferably a C1-C10 alkyl, and wherein the two OR* can form a cycle comprising B and wherein the group Hal* is a halogen, in particular selected from the group: Cl, Br, or I.

Thus, for example, the synthesis of compounds of type (I) can be accomplished by the coupling of two building blocks (i0) and (i1), as illustrated below:

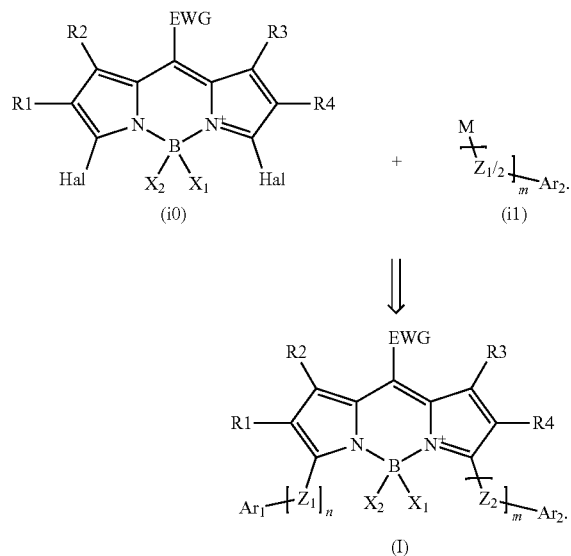

The preparation of the building block (i0) from commercially available materials involves the synthesis steps of condensation, halogenation, oxidation and complexation, as illustrated below:

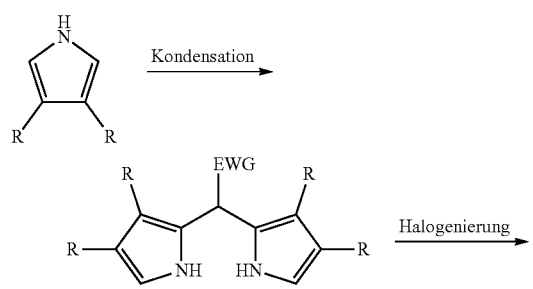

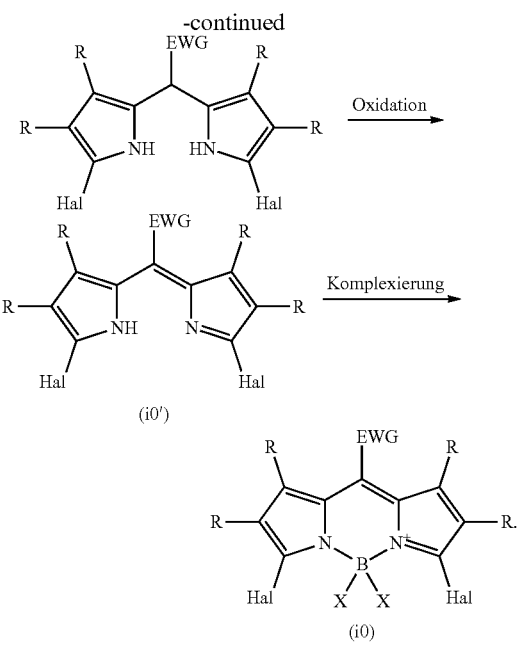

The order of these four individual steps is variable and the skilled person will adapt them to the requirements of the respective substitution pattern accordingly. Usually, several stages can be combined in a single reaction step without having to isolate or purify an intermediate ("one-pot process" or "telescoping"). The reaction sequence described below is therefore to be understood as exemplary only and can be varied accordingly by the person skilled in the art.

Alternatively, the preparation of the compound of formula (I) is also possible by coupling the component (i0') and (i1) with subsequent complexation, wherein the component (i0') is synthesized by the random sequence of the synthesis steps: condensation, halogenation and oxidation.

The possibility of a convergent synthetic route based on a modular principle and established C-C coupling reactions allows economical access to this class of materials. This synthesis route represents a significant advantage over that for other classes of materials described in the literature whose use as near infrared absorbers in organic electronic devices has been proposed.

For example, the authors of WO 2014/206,860 A1 describe a semiconducting component containing materials from the class of dipyrromethene dyes containing fused rings. According to WO 2007/126,052 A1, the synthesis of these materials takes place via a multistage, linear synthesis route. For example, the synthesis of compound 8 of WO 2007/126,052 A1 is carried out via nine linear individual steps, with an overall yield of only 8.2% being given over the last three steps.

Moreover, the prior art requires the use of organic azides. The use of azides, as well as a relatively long, linear synthesis route and low yields, makes it difficult to economically produce this class of materials on an industrial scale.

By contrast, the compounds of the invention are prepared via a convergent synthesis route and a manageable number of individual steps in moderate to very good yields.

Manufacturing Steps

The individual preparation steps of the compounds 1-N according to the invention are given below.

Compound A

Compound A was prepared according to the literature: Li, L. et al., Bioorganic & Medicinal Chemistry Letters (2008), 18 (10), 3112-3116.

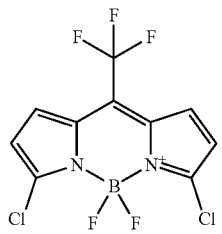

Compounds B and C

Compounds B and C were prepared according to the literature: Paegle, E., European Journal of Organic Chemistry (2015), 2015(20), 4389-4399.

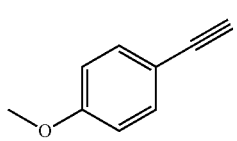

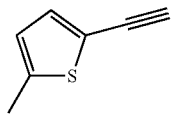

General Procedure AA1: Suzuki Cross-Coupling Reaction

A solution of aryl halide (1 equivalent), the corresponding furan-2-boronic acid (1.2 equivalents) and potassium carbonate (2.5 equivalents) in a mixture of dioxane (1 mL/mmol): water (0.3 mL/mmol) was added in a three-necked flask equipped with reflux condenser, and degassed for 20 minutes in an argon stream. Pd(dppf)2Cl2 (5 mol %) was added and the mixture was stirred for 16 h at 100° C. After cooling to room temperature, water and dichloromethane were added and the phases are separated. The organic phase was washed three times with water, then the aqueous phase was extracted three times with dichloromethane. The combined organic phases were dried over anhydrous sodium sulfate and the solvents were distilled off in vacuo. The crude product was purified by column chromatography (stationary phase: silica gel, eluent: petroleum ether).

General Procedure AA2: Stannylation

In the three-necked flask, 1.2 equivalents of n-butyl-lithium (as a solution in hexane) were added dropwise at −78° C. to a solution of the corresponding aryl compound (1 equivalent) in dry THF (2 mL/mmol). The mixture was stirred for 2 h at −78° C., and then 1.2 equivalents of either tributyltin chloride or a 1M solution of trimethyltin chloride in THF were added dropwise. The mixture was warmed to room temperature within one hour with stirring. Then water and dichloromethane were added and the phases are separated. The organic phase was washed three times with water then the aqueous phase was extracted three times with dichloromethane. The combined organic phases were dried over anhydrous sodium sulfate and the solvents were distilled off in vacuo. The materials thus obtained were used without further a purification step in the subsequent reactions.

General Procedure AA3: Stille Cross-Coupling Reaction 1 equivalent of Compound A and 2.2 equivalents of the corresponding AA2-stannylated aryl compound were dissolved in toluene (20 mL/mmol) in a reaction flask equipped with reflux condenser under an argon atmosphere, and 0.1 equivalent of Pd(PPh3)4 was added. The mixture was stirred for 2 h at 80° C. After cooling, the solvent was distilled off under vacuum. The crude product thus obtained was washed several times with hexane and recrystallized from toluene. Optionally, a second crystallization from dichloromethane/ethanol could be carried out for further purification.

General Procedure AA4: Hydrostannylation

One equivalent of the terminal alkyne was dissolved in toluene (5 mL/mmol) under argon atmosphere. 0.01 equivalent of Pd2(dba)3, 0.04 equivalent of tricyclohexylphosphine and 4 equivalents of N-ethyldiisopropylamine were added sequentially. In a different reaction vessel, 1.2 equivalents of tributylstannyl hydride were diluted under argon atmosphere with 3 ml of toluene. This solution was added dropwise at 0° C. to the reaction mixture. It was allowed to thaw with stirring overnight to room temperature. It was then filtered through a bed of Celite and the solvent of the filtrate was distilled off under vacuum. The material thus obtained was used in the subsequent reaction without further purification steps.

Compound D

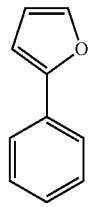

Compound D was prepared according to general procedure AA1 starting from bromobenzene. Compound D was obtained as a colorless oil in 79% yield.

$^1$H NMR (400 MHz, CDCl$_3$): δ (ppm)=7.70-7.67 (m, 2H), 7.48 (dd, $^3$J=1.8 Hz, $^4$J=0.7 Hz, 2H), 7.42-7.37 (m, 2H), 7.26 (tt, $^3$J=7.4 Hz, $^3$J=1.2 Hz, 1H), 6.66 (dd, $^3$J=3.3 Hz, $^4$J=0.7 Hz, 1H), 6.49-6.47 (m, 1H).

Compound E

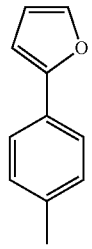

Compound E was prepared according to general procedure AA1 starting from p-bromotoluene. Compound E was obtained as a colorless oil in 55% yield.

$^1$H NMR (400 MHz, CDCl$_3$): δ (ppm)=7.57 (d, $^3$J=8.2 Hz, 2H), 7.46-7.44 (m, 1H), 7.19 (d, $^3$J=8.1 Hz, 2H), 6.59 (d, $^3$J=3.4 Hz, 1H), 6.47-6.45 (m, 1H), 2.36 (s, 3H).

Compound F

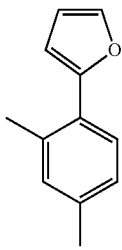

Compound F was prepared according to general procedure AA1 starting from 2,4-dimethylbromobenzene. Compound F was obtained as a colorless oil in 59% yield.

$^1$H NMR (400 MHz, CDCl$_3$): δ (ppm)=7.58 (d, $^3$J=8.4 Hz, 1H), 7.49 (t, $^3$J=1.2 Hz, 1H), 7.09-7.04 (m, 2H), 6.48-6.50 (m, 2H), 2.47 (s, 3H), 2.35 (s, 3H).p Compound G

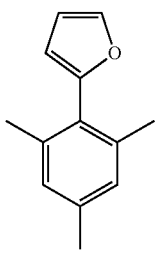

Compound G was prepared according to general procedure AA1 starting from 2,4,6-trimethylbromobenzene. Compound G was obtained as a colorless solid in 57% yield.

$^1$H NMR (400 MHz, CDCl$_3$): δ (ppm)=7.51 (dd, $^3$J=1.8 Hz, $^3$J=0.7 Hz, 1H), 6.93 (s, 2H), 6.50-6.48 (m, 1H), 6.26 (dd, $^3$J=3.2 Hz, $^3$J=0.6 Hz, 1H), 2.32 (s, 3H), 2.18 (s, 6H).

Compound H

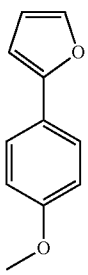

Compound H was prepared according to general procedure AA1 starting from p-bromoanisole. Compound H was obtained as a colorless oil in 88% yield.

$^1$H NMR (400 MHz, CDCl$_3$): δ (ppm)=7.61 (d, $^3$J=8.8 Hz, 2H), 7.43 (s, 1H), 6.93 (d, $^3$J=8.8 Hz, 2H), 6.52 (d, $^3$J=2.8 Hz, 1H), 6.46-6.44 (m, 1H), 3.84 (s, 3H).

Compound I

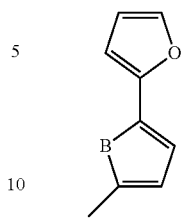

Compound I was prepared according to general procedure AA1 starting from 2-bromo-5-methylthiophene. Compound I was obtained as a colorless oil in 36% yield.

$^1$H NMR (400 MHz, CDCl$_3$): δ (ppm)=7.38-7.36 (m, 1H), 7.03 (d, $^3$J=3.6 Hz, 1H), 6.69-6.67 (m, 1H), 6.43-6.39 (m, 2H), 2.49 (s, 3H).

Compound J

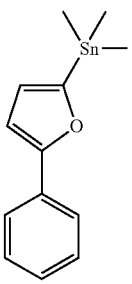

Compound J was prepared according to general procedure AA2 starting from compound D. A crude product was obtained which consists of 50% of compound D and 50% of compound J.

$^1$H NMR (400 MHz, CDCl$_3$): δ (ppm)=7.71-7.66 (m, 2H), 7.41-7.35 (m, 2H), 7.29-7.21 (m, 1H), 6.69-6.63 (M, 2H), 0.37 (s, 9H).

Compound K

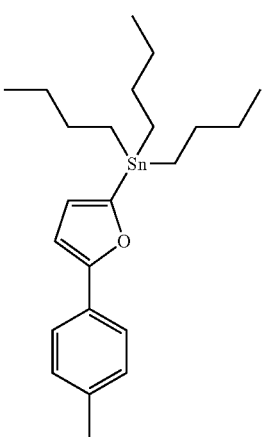 [SMILES: CCC[CH2][Sn]([CH2]CCC)([CH2]CCC)[c]1ccc(-c2ccc(C)cc2)o1]

Compound K was prepared according to general procedure AA2 starting from compound E. Compound K was obtained in 90% yield.

$^1$H NMR (400 MHz, CDCl$_3$): δ (ppm)=7.57 (d, $^3$J=8.4 Hz, 2H), 7.17 (d, $^3$J=8.4 Hz, 2H), 6.63-6.59 (m, 2H), 2.36 (s, 3H), 1.64-1.55 (m, 6H), 1.39-1.32 (m, 6H), 1.14-1.08 (m, 6H), 0.94-0.87 (m, 9H).

Compound L

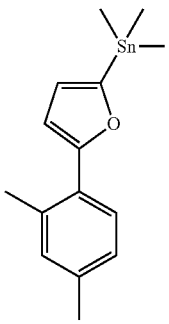

Compound L was prepared according to general procedure AA2 starting from compound F. Compound L was obtained in 95% yield.

$^1$H NMR (400 MHz, CDCl$_3$): δ (ppm)=7.60 (d, $^3$J=8.4 Hz, 2H), 7.08-7.04 (m, 2H), 6.68 (d, $^3$J=3.2 Hz, 1H), 6.52 (d, $^3$J=3.2 Hz, 1H), 2.47 (s, 3H), 2.44 (s, 3H), 0.37 (s, 9H).

Compound M

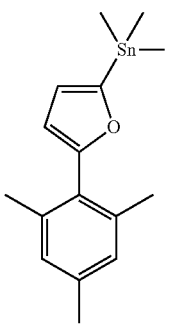

Compound M was prepared according to general procedure AA2 starting from compound G. Compound M was obtained in 95% yield.

$^1$H NMR (400 MHz, CDCl$_3$): δ (ppm)=6.93 (s, 2H), 6.67 (d, $^3$J=3.2 Hz, 1H), 6.29 (d, $^3$J=3.2 Hz, 1H), 2.31 (s, 3H), 2.19 (s, 6H), 0.33 (s, 9H).

Compound N

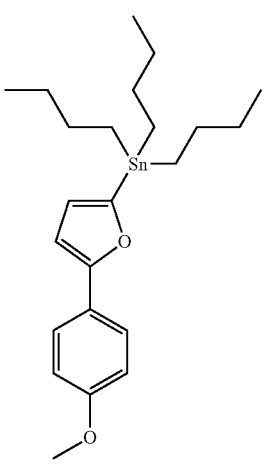 [SMILES: CCC[CH2][Sn]([CH2]CCC)([CH2]CCC)[c]1ccc(-c2ccc(OC)cc2)o1]

Compound N was prepared according to general procedure AA2 starting from compound H. Compound N was obtained in 99% yield.

$^1$H NMR (400 MHz, CDCl$_3$): δ (ppm)=7.60 (d, $^3$J=8.8 Hz, 2H), 6.91 (d, $^3$J=8.8 Hz, 2H), 6.59 (d, $^3$J=2.8 Hz, 1H), 6.54 (d, $^3$J=3.2 Hz, 1H), 3.39 (s, 3H), 1.63-1.57 (m, 6H), 1.39-1.32 (m, 6H), 1.13-1.07 (m, 6H), 0.93-0.87 (m, 9H).

Compound O

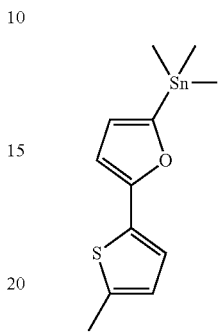

Compound O was prepared according to general procedure AA2 starting from compound I. Compound O was obtained in 95% yield.

$^1$H NMR (400 MHz, CDCl$_3$): δ (ppm)=7.04 (d, $^3$J=3.6 Hz, 1H), 6.68-6.66 (m, 1H), 6.59 (d, $^3$J=3.2 Hz, 2H), 6.42 (d, $^3$J=3.2 Hz, 1H), 2.48 (s, 3H), 0.35 (s, 9H).

Compound P

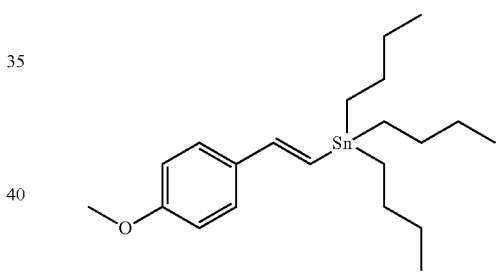

Compound P was prepared according to general procedure AA4 starting from 4-methoxyphenylethyne.

$^1$H NMR (400 MHz, CDCl$_3$): δ (ppm)=7.36 (d, $^3$J=8.8 Hz, 2H), 6.86 (d, $^3$J=8.8 Hz, 2H), 6.82 (d, $^3$J=19.6 Hz, 1H), 6.66 (d, $^3$J=19.6 Hz, 1H), 3.81 (s, 3H), 1.57-1.44 (m, 6H), 1.39-1.27 (m, 6H), 0.98-0.86 (m, 15H).

Compound Q

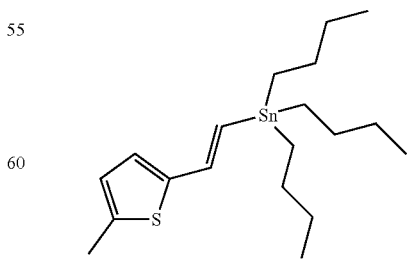

Compound Q was prepared according to general procedure AA4 starting from 5-methyl-2-thienylethine.

$^1$H NMR (400 MHz, CDCl$_3$): δ (ppm)=6.85 (d, $^3$J=19.2 Hz, 1H), 6.68 (d, $^3$J=3.2 Hz, 1H), 6.61-6.59 (m, 1H), 6.41 (d, $^3$J=19.2 Hz, 1H), 2.45 (s, 3H), 1.55-1.48 (m, 6H), 1.38-1.28 (m, 6H), 0.96-0.85 (m, 15H).
Compound R

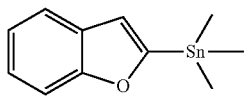

Compound R was prepared according to the general working procedure AA2, starting from benzofuran. Compound R was obtained in 97% yield.

$^1$H NMR (400 MHz, CDCl$_3$): δ (ppm)=7.57-7.53 (m, 1H), 7.52-7.48 (m, 1H), 7.26-7.16 (m, 2H), 6.93 (d, $^3$J=0.9 Hz, 1H), 0.41 (s, 9H).
Compound S

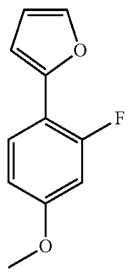

Compound S was prepared according to general procedure AA1, starting from compound R. Compound S was obtained in 58% yield as a colorless oil.

$^1$H NMR (400 MHz, CDCl$_3$): δ (ppm)=7.64 (t, $^3$J=8.8 Hz, 1H), 7.38 (d, $^3$J=1.2 Hz, 1H), 6.68 (ddd, $^3$J=8.8 Hz, $^4$J=2.8 Hz, $^4$J=2.0 Hz, 1H), 6.63-6.58 (m, 2H), 6.43-6.41 (m, 1H), 3.75 (s, 3H).
Compound T

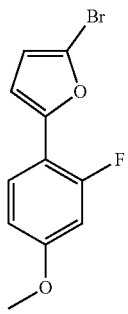

Compound S (5.09 mmol) was dissolved in 30 mL DMF. The solution was cooled to 0° C. and a solution of 5.6 mmol NBS in 20 mL DMF was added dropwise. After thawing at R.T., the solution was stirred for 16h. Then water and dichloromethane were added and the phases were separated. The organic phase was washed three times with water, then the aqueous phase was extracted three times with dichloromethane. The combined organic phases were dried over anhydrous sodium sulfate and the solvents were distilled off in vacuo. The crude product was purified by column chromatography (stationary phase: silica gel, eluent: petroleum ether). Compound T was obtained in 66% yield as a white solid which turned black upon exposure to light.

$^1$H NMR (400 MHz, CDCl$_3$): δ (ppm)=7.68 (t, $^3$J=8.8 Hz, 1H), 6.74 (dd, $^3$J=8.8 Hz, $^{43}$J=2.8 Hz, 1H), 6.70-6.62 (m, 2H), 6.41-6.38 (m, 1H), 3.83 (s, 3H)
Compound U

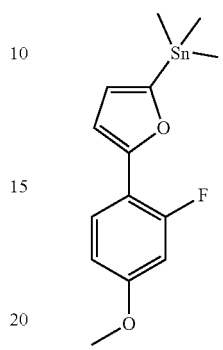

Compound U was prepared in accordance with General Procedure AA2, starting from Compound T. Compound U was obtained in 89% yield.

$^1$H NMR (400 MHz, CDCl$_3$): δ (ppm)=7.77 (t, $^3$J=8.8 Hz, 1H), 6.78-6.65 (m, 4H), 3.83 (s, 3H), 0.37 (s, 9H).
Compound V

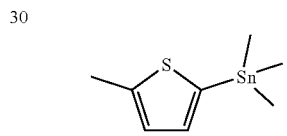

Compound V was prepared according to the literature: Seitz, D. E., Lee, S.-H., Hanson, R. N., Bottaro, J. C. Synth. Comm., (1983), 13, 121-128.
Compound W

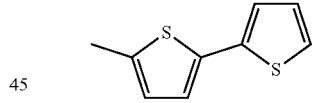

Compound W was prepared according general AA3, starting from V. Compound W was obtained in 99% yield after chromatographic purification.
Compound X

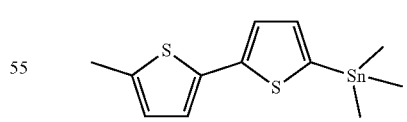

Compound X was prepared according to general procedure AA2, starting from compound W, and was obtained in 93% yield.

$^1$H NMR (400 MHz, CDCl$_3$): δ (ppm)=7.20 (d, $^3$J=3.3 Hz, 1H), 7.07 (d, $^3$J=3.3 Hz, 1H), 6.96 (d, $^3$J=3.5 Hz, 2H), 6.66-6.65 (m, 1H), 2.48 (s, 3H), 0.38 (s, 9H).

Embodiments of compounds of the invention, previously shown as structures 1 to 12, were prepared according to the general procedure AA3.

TABLE 1

| structure | starting materials | yield | $^1$H-NMR (400 MHz) |
|---|---|---|---|
| 1 | A, Furan-2-boronic acid | 46% | (CDCl$_3$): δ (ppm) = 7.81 (d, $^3$J = 3.6 Hz, 2H), 7.65 (d, $^3$J = 2.0 Hz, 2H), 7.35-7.31 (m, 2H), 7.10 (d, 3J = 4.4 Hz, 2H), 6.68 (m, 2H) |
| 2 | A, J | 52% | (C$_2$D$_2$Cl$_4$, 373 K): δ (ppm) = 7.90-7.86 (m, 6H), 7.51 (t, $^3$J = 5.6 Hz, 4H), 7.45-7.38 (m, 4H), 7.25 (d, $^3$J = 4.0 Hz, 2H), 7.01 (d, $^3$J = 3.2 Hz, 4H) |
| 3 | A, K | 38% | (C$_2$D$_2$Cl$_4$, 373 K): δ (ppm) = 7.87 (d, $^3$J = 3.2 Hz, 2H), 7.77 (d, $^3$J = 6.8 Hz, 4H), 7.40-7.36 (m, 2H), 7.31 (d, $^3$J = 6.4 Hz, 4H), 7.23 (d, $^3$J = 3.6 Hz, 2H), 6.95 (d, $^3$J = 2.8 Hz, 2H), 2.47 (s, 6H) |
| 4 | A, M | 59% | (C$_2$D$_2$Cl$_4$, 373 K): δ (ppm) = 7.98 (m, 2H), 7.36 (m, 2H), 7.16 (m, 2H), 7.02 (s, 4H), 6.66 (d, $^3$J = 2.8 Hz, 2H), 2.39 (s, 6H), 2.35 (s, 12H) |
| 5 | A, L | 51% | (C$_2$D$_2$Cl$_4$, 373 K): δ (ppm) = 7.93 (d, $^3$J = 3.2 Hz, 2H), 7.76 (d, $^3$J = 6.8 Hz, 2H), 7.40-7.37 (m, 2H), 7.21 (d, $^3$J = 3.6 Hz, 2H), 7.19-7.15 (m, 4H), 6.88 (d, $^3$J = 3.2 Hz, 2H), 2.64 (s, 6H), 2.44 (s, 6H) |
| 6 | A, N | 37% | (DMSO, 373 K): δ (ppm) = 7.93 (d, $^3$J = 9.8 Hz, 4H), 7.85 (d, $^3$J = 2.8 Hz, 2H), 7.46-7.39 (m, 4H), 7.25 (d, $^3$J = 3.2 Hz, 2H), 7.08 (d, $^3$J = 7.2 Hz, 2H), 3.88 (s, 6H) |
| 7 | A, Q | 33% | (C$_2$D$_2$Cl$_4$, 373 K): δ (ppm) = 7.49 (d, $^3$J = 15.2 Hz, 2H), 7.46 (d, $^3$J = 15.6 Hz, 2H), 7.33-7.29 (m, 2 H), 7.19 (d, $^3$J = 2.8 Hz, 2H), 6.99 (d, $^3$J = 3.6 Hz, 2H), 6.83-6.81 (m, 2H), 2.60 (s, 6H) |
| 8 | A, O | 42% | (C$_2$D$_2$Cl$_4$, 373 K): δ (ppm) = 7.85 (d, $^3$J = 3.2 Hz, 2H), 7.37-7.34 (m, 2H), 7.33 (d, $^3$J = 2.8 Hz, 2H), 7.18 (d, 2J = 3.6 Hz, 2H), 6.84-6.81 (m, 2H), 6.76 (d, $^3$J = 2.8 Hz, 2H), 2.60 (s, 6H) |
| 9 | A, P | 33% | (CDCl$_3$, 373K): δ (ppm) = 7.64 (d, $^3$J = 16.4 Hz, 2H), 7.62 (d, $^3$J = 8.8 Hz, 4H), 7.38 (d, $^3$J = 16.4 Hz, 2H), 7.29-7.26 (m, 2H), 6.99 (d, $^3$J = 4.4 Hz, 2H), 6.96 (d, $^3$J = 8.8 Hz, 4H), 3.87 (s, 6H) |
| 10 | A, U | 35% | (C$_2$D$_2$Cl$_4$, 373 K): δ (ppm) = 7.95 (t, $^3$J = 8.5 Hz, 2H), 7.86 (d, $^3$J = 3.5 Hz, 2H), 7.38 (s, 2H), 7.21 (d, $^3$J = 4.5 Hz, 2H), 7.04 (t, $^3$J = 3.5 Hz, 2H), 6.87 (dd, $^3$J = 8.5 Hz, $^4$J = 2.5 Hz, 2H), 6.80 (dd, $^3$J = 12.5 Hz, $^4$J = 2 Hz, 2H), 6.56 (s, 6H) |
| 11 | A, R | 39% | (C$_2$D$_2$Cl$_4$, 373 K): δ (ppm) = 8.25 (s, 2H), 7.84 (d, $^3$J = 6.4 Hz, 2H), 7.61 (d, $^3$J = 6.8 Hz, 2H), 7.53-7.47 (m, 4H), 7.41-7.36 (m, 4H). |
| 12 | A, X | 37% | (C$_2$D$_2$Cl$_4$, 373 K): δ (ppm) = 8.17 (d, $^3$J = 3.2 Hz, 2H), 7.36 (s, 2H), 7.27 (d, $^3$J = 3.3 Hz, 2H), 7.20 (d, $^3$J = 2.8 Hz, 2H), 6.97 (d, $^3$J = 3.6 Hz, 2H), 6.79 (d, $^3$J = 2.8 Hz, 2H), 2.57 (s, 6H). |

Embodiments

It has been shown that the structures/compounds according to the invention have high thermal stability and can be evaporated in vacuo. Surprisingly, it has been found that films formed from compounds of the invention absorb particularly broadly in the near-infrared region, above 650/700 nm, which is no longer visible to the human eye. In this connection, the following table shows the absorption maxima and the half widths of 30 nm thick, vacuum-deposited films formed from compounds of the invention. By half-width is meant the difference between the two wavelengths for which the absorption values have dropped to half of the maximum value.

Reference material V1

[Bura et al., J. Am. Chem. Soc. (2012), 134, 17404-17407]: The reference material V1 is not evaporable in a high vacuum without decomposition. It is therefore not possible to produce vacuum-processed components with V1.

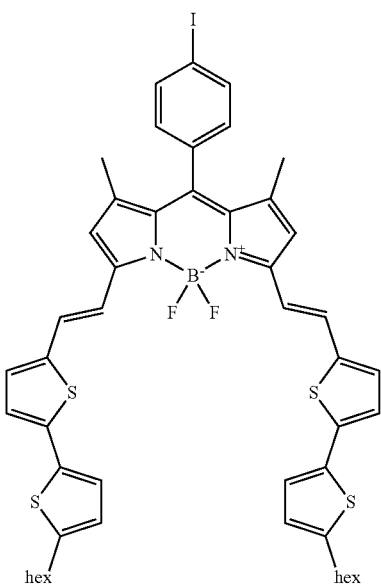

Reference material V2

The NIR absorber for vacuum-processed solar cells (reference material V2) described in WO 2015/036,529 absorbs in the film at 781 nm.

Due to the very narrow absorption range (half width of 55 nm) only a very small spectral range can be used for the optoelectronic conversion.

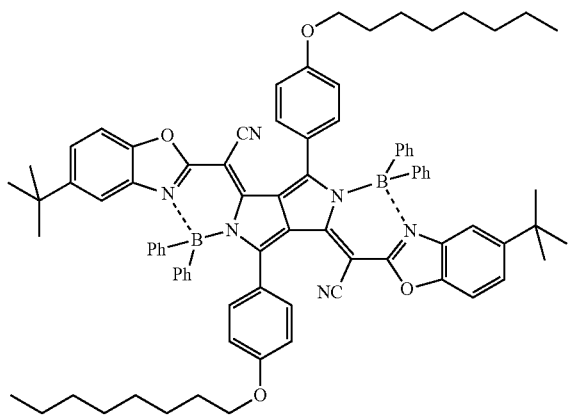

Reference material V3

According to the authors, the reference material V3, mentioned in WO 2010/133.208 A1, is a material absorbing in the red and near-infrared region. A semiconducting device using connections of this type was described therein. If one compares the characteristics of the comparison material V3 with the the characteristics of the compounds of the invention in a vacuum-processed mixed-layer solar cell, the superiority of the compounds of the invention becomes clear, in particular for the generated photocurrent.

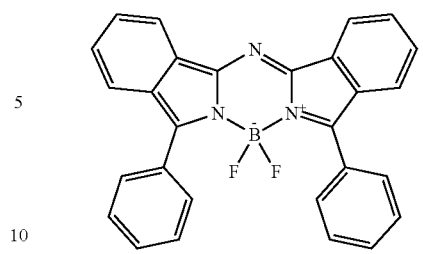

TABLE 2

| compound | Absorption maxima [nm] | FWHM [nm] |
|---|---|---|
| 1 | 795 | 235 |
| 2 | 839 | 234 |
| 3 | 849 | 226 |
| 4 | 769 | 155 |
| 5 | 849 | 228 |
| 6 | 869 | 220 |
| 7 | 816 | 214 |
| 8 | 887 | 257 |
| 9 | 781 | 185 |
| 10 | 916 | 248 |
| 11 | 640 | 142 |
| 12 | 788 | 184 |
| V1 | not evaporable in vacuo | |
| V2 | 781 | 55 |
| V3 | | |

Individual compounds were used to produce vacuum-processed solar cells. The following Table 3 displays various parameters of the series of materials in direct comparison. The photovoltaic parameters Voc, Jsc and FF are reported for solar cells having a 30 nm thick mixed layer on glass, the photoactive layer comprising the respective experimental compound as the donor material and fullerene C60, and the solar cell having the structure ITO/C60/the respective experimental compound: C60/HTMX/HTMX: DPY/DPY/Au, wherein HTMX is a hole transport material and DPY is a dopand. The reported parameters were measured under AM1.5 illumination (AM=Air Mass; AM=1.5—under air mass of 1.5, the spectrum of light has global radiation power=1000 W/m$^2$; AM=1.5 is the standard value for the measurement of solar modules).

ITO serves as the anode in these test examples, and the adjacent fullerene C60 as the electron transport layer (ETL), followed by the photoactive layer as a volume heterojunction of C60 as electron acceptor material and the respective experimental compound as electron donor material, followed by HTMX as Hole transport layer (HTL), DPY doped HTMX and a DPY layer, followed by an Au cathode.

TABLE 3

| Compound | Voc [V] | Jsc [mA/cm$^2$] | FF [%] | Eff [%] |
|---|---|---|---|---|
| 1 | 0.85 | 5.50 | 52.90 | 2.47 |
| 2 | 0.63 | 8.80 | 52.10 | 2.89 |
| 3 | 0.69 | 9.90 | 59.10 | 4.04 |
| 4 | 0.91 | 6.30 | 37.80 | 2.17 |
| 5 | 0.73 | 8.20 | 42.50 | 2.54 |
| 6 | 0.53 | 4.50 | 60.40 | 1.44 |
| (6 nm, planar junction) | | | | |
| 7 | 0.70 | 8.70 | 56.80 | 3.46 |
| 8 | 0.43 | 8.10 | 38.00 | 1.32 |
| 9 | 0.70 | 10.30 | 64.20 | 4.63 |
| 10 | 0.58 | 9.60 | 44.60 | 2.48 |

TABLE 3-continued

| Compound | Voc [V] | Jsc [mA/cm²] | FF [%] | Eff [%] |
|---|---|---|---|---|
| V2 | 0.97 | 2.80 | 35.30 | 0.85 |
| V3 | 0.65 | 2.47 | 64.89 | 1.04 |

For the comparison material V2, the characteristics of a vacuum-processed solar cell listed in WO 2015/036,529 were used. From this it is clear that the compounds of the invention are superior, in particular because of their significantly higher photocurrent. Although the mixed-layer solar cell described in WO 2015/036,529 only has an active layer thickness of 20 nm, the photocurrent of the compounds according to the invention is many times higher, which cannot be explained solely by the layer thickness being 50% higher. For comparison material V2, it is also observed that as the layer thickness increases from 10 to 20 nm, both FF and photocurrent sink. In the case of the compounds of the invention, by contrast, high filling factors can be achieved even at greater layer thicknesses of 30 nm.

While the invention has been illustrated and described in detail in the drawings and foregoing description, such illustration and description are to be considered illustrative or exemplary and not restrictive. It will be understood that changes and modifications may be made by those of ordinary skill within the scope of the following claims. In particular, the present invention covers further embodiments with any combination of features from different embodiments described. Additionally, statements made herein characterizing the invention refer to an embodiment of the invention and not necessarily all embodiments.

The terms used in the claims should be construed to have the broadest reasonable interpretation consistent with the foregoing description. For example, the use of the article "a" or "the" in introducing an element should not be interpreted as being exclusive of a plurality of elements. Likewise, the recitation of "or" should be interpreted as being inclusive, such that the recitation of "A or B" is not exclusive of "A and B," unless it is clear from the context or the foregoing description that only one of A and B is intended. Further, the recitation of "at least one of A, B and C" should be interpreted as one or more of a group of elements consisting of A, B and C, and should not be interpreted as requiring at least one of each of the listed elements A, B and C, regardless of whether A, B and C are related as categories or otherwise. Moreover, the recitation of "A, B and/or C" or "at least one of A, B or C" should be interpreted as including any singular entity from the listed elements, e.g., A, any subset from the listed elements, e.g., A and B, or the entire list of elements A, B and C.

The invention claimed is:

1. A chemical compound of formula (I):

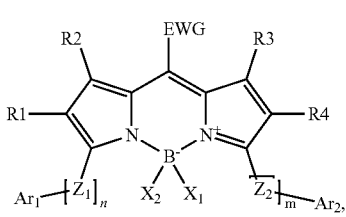

(I)

a) wherein n and m are each independently 0, 1 or 2;
b) wherein X1 and X2 are each independently selected from the group consisting of halogen, CN, alkyl, or fluorinated or partially fluorinated alkyl;
c) wherein EWG is CF3 or a fully or partially fluorinated, branched or unbranched, linear or cyclic alkyl chain;
d) wherein z1 and z2 are selected from the formulas (II) to (IV):

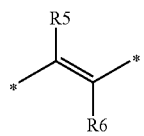

(II)

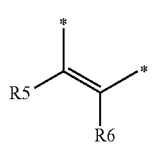

(III)

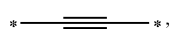

(IV)

wherein "*" denotes in each case the bonding site of the substituent z1 or z2 to either the dipyrrin skeleton or one of the aryl substituents Ar1 and Ar2;
e) wherein R1 to R4 are each independently selected from the group consisting of H, or a branched or unbranched, linear or cyclic alkyl chain;
f) wherein R5 and R6 are each independently selected from the group consisting of H, halogen, CN, or a substituted or unsubstituted, branched or unbranched, linear or cyclic alkyl chain;
g) wherein Ar1 in the case of n>0 and/or Ar2 in the case of m>0, is a substituted or unsubstituted heterocyclic 5-membered ring, and Ar1 in the case of n=0 and/or Ar2 in the case of m=0 corresponds to the formula (V), and "*" is the bonding site of the substituent Ar1 or Ar2 to the dipyrrin skeleton,

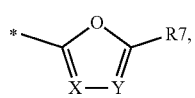

(V)

wherein X is N or C-R8;
wherein Y is N or C-R9;
wherein R7 to R9 are independently selected from:
a group consisting of H, halogen, or branched or linear, cyclic or open-chain alkyl or aryl, wherein H atoms and/or C atoms of the alkyl or aryl may be substituted, or
a group consisting of alkenyl, O-alkyl, S-alkyl, O-alkenyl, S-alkenyl, alkynyl, aryl or heteroaryl, wherein in all these groups H atoms may be substituted, or
CN or NR'R", wherein R' and R" are each independently: H or a branched or linear, cyclic or open-chain alkyl, wherein H and/or C atoms of the alkyl may be substituted, or
wherein R7 and R9 may together form a homo- or heterocyclic, saturated or unsaturated, substituted or unsubstituted ring.

2. The chemical compound of claim 1, wherein H atoms of the alkyl, aryl, alkenyl or alkynyl of R7 to R9 are wholly or partly replaced by a halogen and/or wherein C atoms of the alkyl and aryl are replaced by a heteroatom.

3. The chemical compound of claim 1, wherein R1 to R4 are independently H, methyl or an alkyl.

4. The chemical compound of claim 1, wherein R5 to R6 are independently H, methyl or an alkyl.

5. The chemical compound of claim 1, wherein EWG is $CF_3$.

6. The chemical compound of claim 1, wherein X1 or X2 is a halogen.

7. The chemical compound of claim 1, wherein the compound is mirror symmetrical with respect to the axis formed by EWG and B.

8. The chemical compound of claim 1, which is one of the following compounds:

Struktur 1

Struktur 2

Struktur 3

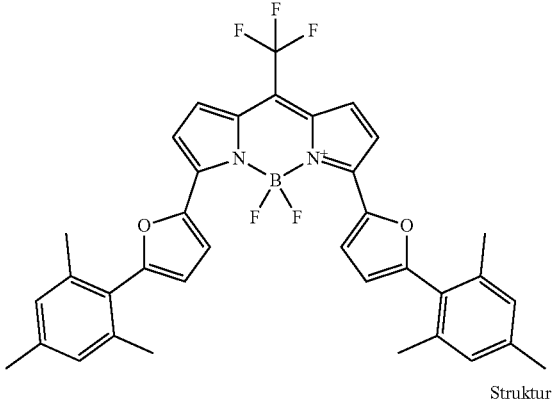

Struktur 4

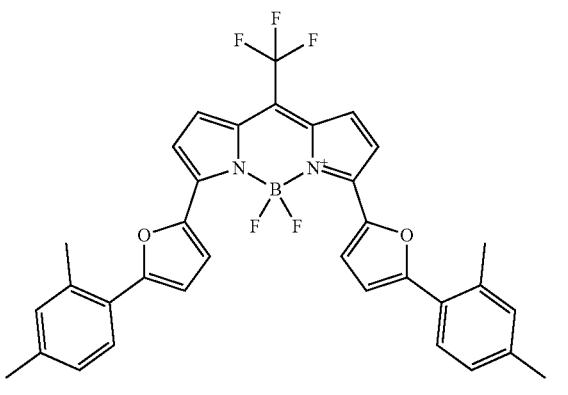

Struktur 5

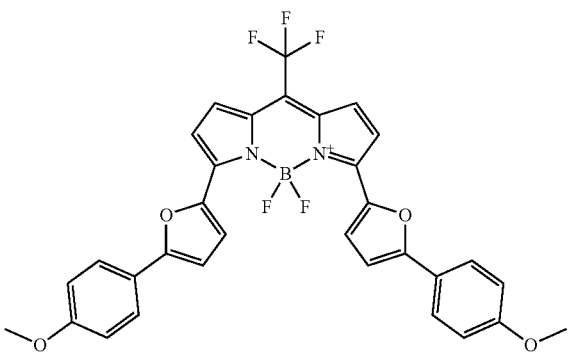

Struktur 6

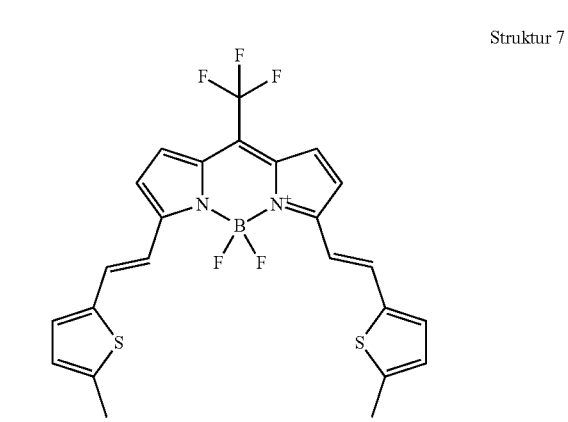

Struktur 7

Struktur 8

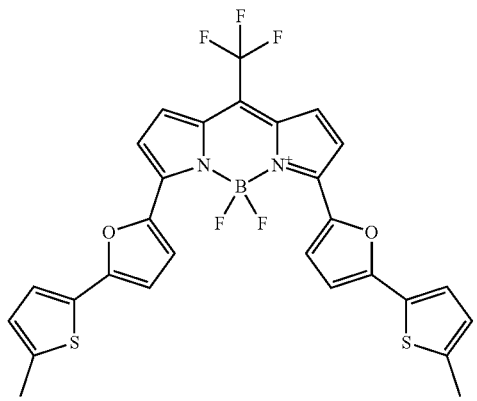

Struktur 10

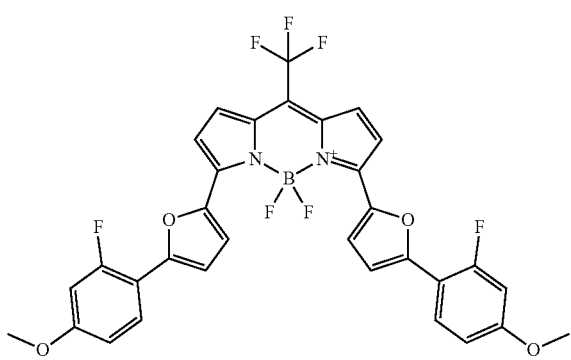

Struktur 11

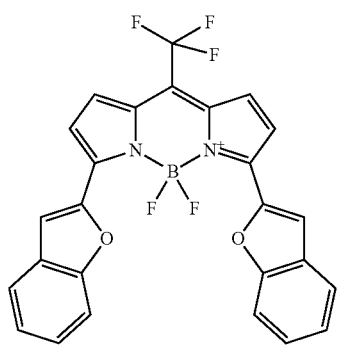

Struktur 13

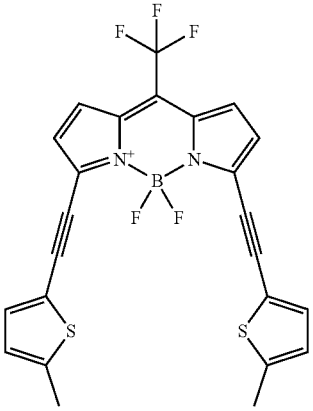

Struktur 14

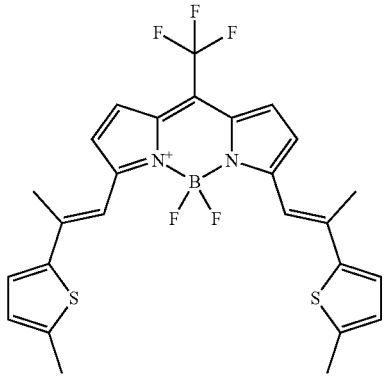

9. The chemical compound of claim 1, wherein the heteroatoms of the heterocyclic 5-membered rings of Ar1 or Ar2 are O or S.

10. The chemical compound of claim 2, wherein H atoms of the alkyl, aryl, alkenyl or alkynyl of R7 to R9 are wholly or partly replaced by F, and/or wherein C atoms of the alkyl and aryl are replaced by O or S.

11. The chemical compound of claim 3, wherein R1 to R4 are independently H or methyl.

12. The chemical compound of claim 4, wherein R5 to R6 are H.

13. The chemical compound of claim 6, wherein the halogen is F.

14. An organic optoelectronic component comprising two electrodes, one electrode representing the substrate electrode and the other electrode acting as the counter electrode, wherein between the two electrodes is a layer stack comprising at least one cell structure, the at least one cell structure comprising at least one organic layer and at least one transport layer, wherein the organic layer and/or the transport layer comprises a compound of claim 1.

15. The organic optoelectronic component of claim 14, wherein at least one photoactive layer of the organic optoelectronic component is a light-absorbing layer comprising the chemical compound as at least one absorber material therein.

16. The organic optoelectronic component of claim 14, wherein the organic optoelectronic components are organic solar cells, OLEDs, or photodetectors.

* * * * *